United States Patent [19]
Birang et al.

[11] Patent Number: 5,491,603
[45] Date of Patent: Feb. 13, 1996

[54] METHOD OF DETERMINING A DECHUCKING VOLTAGE WHICH NULLIFIES A RESIDUAL ELECTROSTATIC FORCE BETWEEN AN ELECTROSTATIC CHUCK AND A WAFER

[75] Inventors: Manoocher Birang, Los Gatos; Jian Ding, San Jose, both of Calif.; Hyman J. Levinstein, Berkeley Heights, N.J.

[73] Assignee: Applied Materials, Inc., Santa Clara, Calif.

[21] Appl. No.: 235,012

[22] Filed: Apr. 28, 1994

[51] Int. Cl.$^6$ .................................................. H02N 13/00
[52] U.S. Cl. ........................................................ 361/234
[58] Field of Search ................................... 361/230, 233, 361/234, 235

[56] References Cited

U.S. PATENT DOCUMENTS

| | | | |
|---|---|---|---|
| 4,565,601 | 1/1986 | Kakehi et al. | 156/643 |
| 4,667,110 | 5/1987 | Kariya | 250/492.2 |
| 5,221,450 | 6/1993 | Hattori et al. | 204/192.32 |
| 5,270,266 | 12/1993 | Hirano et al. | 437/228 |
| 5,315,473 | 5/1994 | Collins et al. | 361/234 |

FOREIGN PATENT DOCUMENTS 64-18236  1/1989  Japan.

OTHER PUBLICATIONS

IBM Technical Disclosure Bulletin, vol. 31, No. 1, Jun. 1988, pp. 462–464, "Electrostatic Wafer Holder for Water Cooling During Reactive Ion Etching".

Primary Examiner—A. D. Pellinen
Assistant Examiner—Fritz M. Fleming
Attorney, Agent, or Firm—Peter Sgarbossa; Robert M. Wallace

[57] ABSTRACT

The invention is embodied in a method of determining an optimum de-chucking voltage for nullifying residual electrostatic forces on a wafer in an electrostatic chuck for removal of the wafer from the chuck, including holding the wafer on the electrostatic chuck by applying an electrostatic potential to the chuck, introducing a gas between the wafer and the chuck, reducing the electrostatic potential of the chuck while observing a rate of leakage of the gas from between the wafer and the chuck, and recording as the optimum dechucking voltage the value of the electrostatic potential obtaining when the rate of leakage exceeds a predetermined threshold.

61 Claims, 4 Drawing Sheets

METHOD OF DETERMINING A DECHUCKING VOLTAGE WHICH NULLIFIES A RESIDUAL ELECTROSTATIC FORCE BETWEEN AN ELECTROSTATIC CHUCK AND A WAFER

RELATED APPLICATION

This application discloses subject matter related to the subject matter of co-pending U.S. patent application Ser. No. 08/207,331 filed Mar. 7, 1994 by M. Birang et al. entitled "releasing a Workpiece from an Electrostatic Chuck".

BACKGROUND OF THE INVENTION

1. Technical Field

The invention is related to plasma-enhanced semiconductor wafer processing apparatus such as plasma reactors for etching or chemical vapor deposition, having an electrostatic chuck for holding the wafer in place, and in particular to a method of de-chucking or removing the wafer from the chuck with a minimum of force.

2. Background Art

When using an electrostatic chuck to hold a wafer in a plasma reactor chamber, one of the difficulties to overcome is that the wafer adheres or "sticks" to the chuck at the end of the process when the wafer is to be removed from the chamber. The severity of this sticking can range from breaking the wafer while attempting to lift it off of the electrostatic chuck to misplacing the wafer on the wafer-handling robot's blade when the wafer is being unloaded from the reactor chamber. The sticking is attributed to static charge buildup on the surface of the electrostatic chuck's dielectric layer facing the wafer.

As disclosed in related U.S. patent application referenced above, it has been determined that there exists a particular voltage value that, if applied to the electrostatic chuck electrode, can compensate for the electrostatic field that causes the wafer sticking, so that the wafer is easily de-chucked with virtually no sticking force to overcome. However, the methods disclosed for determining the optimum dechucking voltage involve sophisticated measurement of a very short electrical pulse that occurs as the wafer is lowered onto the chuck. A goal of the present invention is to determine the optimum dechucking voltage without requiring measurements of electrical pulses.

SUMMARY OF THE DISCLOSURE

The invention is embodied in a method of determining an optimum de-chucking voltage for nullifying residual electrostatic forces on a workpiece, such as a trial workpiece or a wafer in an electrostatic chuck for removal of the wafer from the chuck, including holding the wafer on the electrostatic chuck by applying an electrostatic potential to the chuck, introducing a gas between the wafer and the chuck, reducing the electrostatic potential of the chuck while observing a rate of leakage of the gas from between the wafer and the chuck, and recording as the optimum dechucking voltage the value of the electrostatic potential obtaining when the rate of leakage exceeds a predetermined threshold. Preferably, the step of observing the rate of leakage comprises comparing a current value of a flow rate of the gas with a value of the flow rate of the gas measured prior to the step of reducing the electrostatic potential. Preferably, the step of reducing the electrostatic potential is performed in discrete steps, and the step of observing a rate of leakage is repeated at each step. Preferably, the predetermined threshold corresponds to a point at which the wafer begins to float on the electrostatic chuck.

DETAILED DESCRIPTION OF PREFERRED EMBODIMENTS

1. Conventional Plasma Chamber with Electrostatic Chuck

Figure 1:
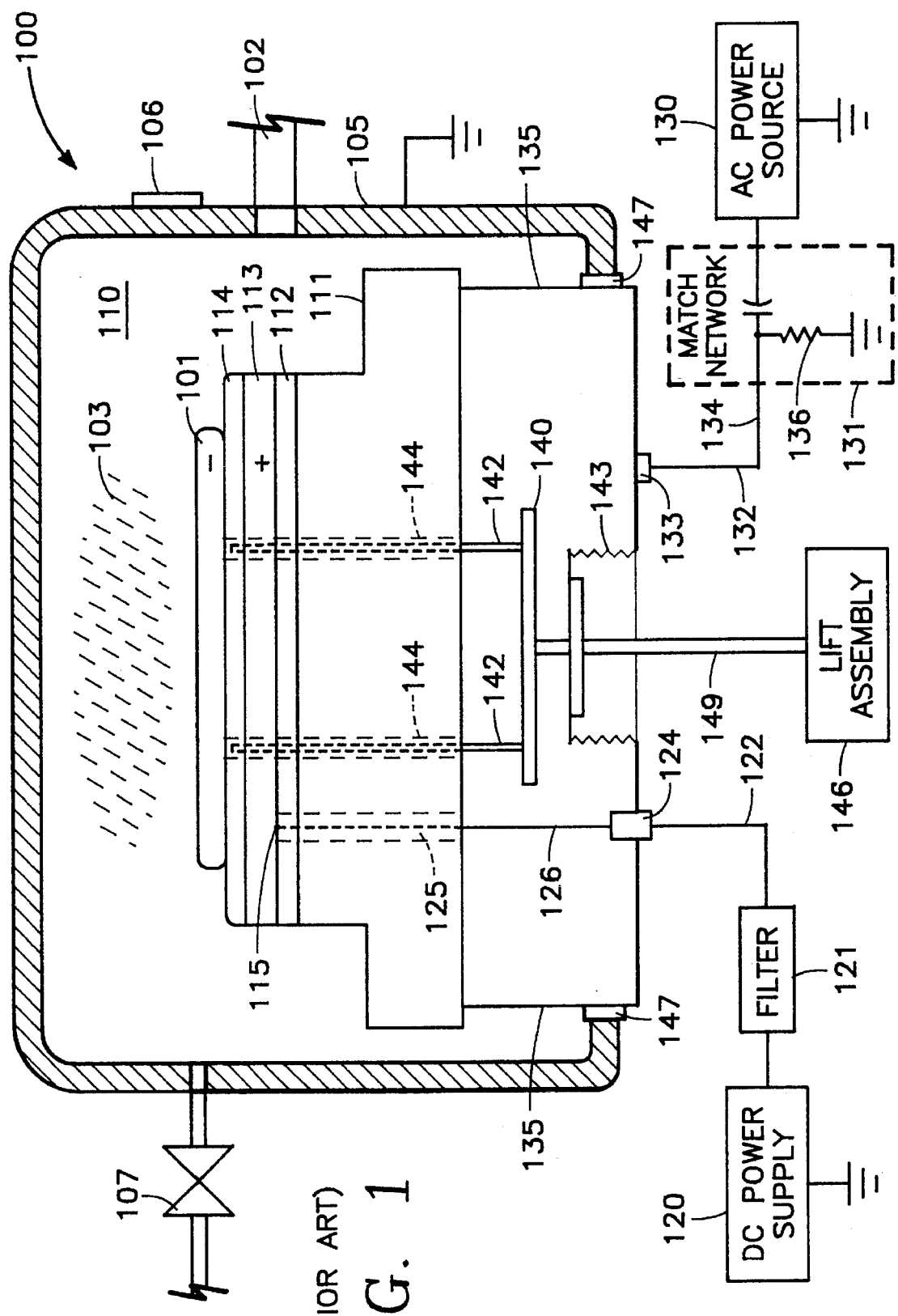
FIG. 1 is a simplified schematic diagram of a plasma reactor and electrostatic chuck of the prior art.

A conventional electrostatic chuck 110 is shown in FIG. 1 as it typically would be configured within a vacuum chamber 100 used for plasma-enhanced processing (for example, etching or chemical vapor deposition) of a semiconductor wafer 101.

The conventional vacuum chamber 100 includes a vacuum-tight enclosure 105 which is made of aluminum and electrically grounded. The chamber wall is the anode.

The conventional electrostatic chuck includes a solid aluminum cathode pedestal 111 having a circular, planar top face; a lower dielectric layer 112 bonded to the top face of the pedestal 111; a metal chuck electrode 113 bonded to the tope face of the lower dielectric; and an upper dielectric layer 114 bonded to the top face of the chuck electrode. In the preferred embodiment, both dielectric layers are 75 micron thick polyimide.

The cathode pedestal 111 is mounted on top of, and electrically connected to, a hollow aluminum cathode base 135. The cathode base is mounted on the lower wall of enclosure 105 by means of an electrically insulating, annular flange 147. A copper rod 133 is screwed to the bottom of the cathode 135. A copper clip 132 snaps around the copper rod 133 and is connected mechanically and electrically to an impedance matching network 131, which in turn connects to an RF power supply 130. The matching network 134 includes a 10 megohm resistor 136 across its output to provide a DC path from the cathode to ground.

Another insulated wire 126 is attached to the chuck electrode 113 at point 115. The wire 126 extends through a bore 125 in the cathode pedestal 111 and then out the bottom of the enclosure 105 through a feed-through insulator 124 to an RF-blocking low pass filter 121, and in turn to DC voltage supply 120.

During processing of a semiconductor wafer 101 in the chamber 100, the wafer rests on the upper face of the upper dielectric 114 as shown in FIG. 1. After processing is completed, a robot arm (not shown) removes the wafer from the chamber. To facilitate sliding the "blade" end of the robot arm under the wafer, several (preferably four, but at least three) lift pins 142 lift the wafer 2 to 5 cm above the chuck 110. Each lift pin 142 slides vertically in a corresponding bore 144 in the cathode pedestal 111. All the lift pins 142 are mounted on a carriage 140, which is raised and lowered by a pneumatic lift mechanism 146 under control of a programmable digital computer (not shown). In the illustrated embodiment, the lift pins 142 and carriage 140 are inside the cathode base 135 within the vacuum chamber 100, whereas the pneumatic lift mechanism 146 is outside the vacuum chamber. They are mechanically connected by a linkage 149 passing through a bellows 143 which permits movement while maintaining a vacuum seal.

In the conventional operation of the process chamber 100, a robot arm (not shown) moves a wafer 101 into the chamber through a slit valve 106. The robot places the wafer on the tips of lift pins 142, which at this time are elevated by the pneumatic lift mechanism 146 so as to protrude 2 to 5 cm above the top of the electrostatic chuck 110. The pneumatic mechanism then lowers the lift pins 142 so that the wafer 101 drops onto the top face of the chuck 110, the wafer's descent time typically is 3 to 10 seconds.

Shortly before the wafer 101 drops onto the chuck 110, the chucking voltage supply 120 applies a high DC voltage, on the order of +2000 volts (but can also range from one thousand volts to several thousand volts), to the chuck electrode 113 relative to ground. Typically at least one (preferably all) of the lift pins 142 is metal and is electrically connected to the cathode base 135, which in turn is connected to an electrical ground through the 10 megohm resistor 136. As the lift pins lower the wafer onto the chuck, the grounded lift pin(s) maintain the wafer at or near ground potential, so that the 2000 volt chucking voltage appears between the wafer and the chuck electrode 113. This voltage causes negative and positive charges to accumulate on the facing surfaces of the wafer and chuck electrode, respectively. The amount of charge is proportional to the product of the voltage and the capacitance between the wafer and the chuck electrode.

After the wafer drops onto the upper dielectric 114 of the chuck 110, the lift pins 142 continue to descend, so that the wafer no longer is electrically grounded. However, the charge remains trapped on the wafer. The opposite polarity charges on the wafer and the chuck electrode produce an electrostatic attractive force which presses the wafer against the upper face of the chuck. The chucking voltage (2000 volts in this example) is set to a value high enough to produce an electrostatic force between the wafer and the chuck adequate to prevent wafer movement during subsequent process steps. The wafer thus retained securely on the chuck is said to be "chucked".

After the wafer is chucked, one or more semiconductor fabrication process steps are performed in the chamber 100, such as deposition or etching films on the wafer. For processes which employ a plasma, the RF power supply 130 applies RF power between the cathode pedestal 111 and the grounded anode 104, which excites a plasma in the region between the wafer 101 and the anode. The plasma provides an electrically conductive path between the wafer and ground. However, because of the difference between the mobilities of electrons and positive ions, a DC voltage drop appears across the plasma so that the wafer is biased negative relative to ground. If the chucking voltage applied to the chuck electrode 113 by the DC voltage supply 120 is positive, the total voltage between the wafer and the chuck electrode will be the sum of the wafer bias voltage and the chucking power supply voltage. Thus, the wafer bias increases the electrostatic force retaining the wafer.

After completion of the semiconductor fabrication process steps, the pneumatic lift mechanism 146 raises the lift pins 142 to raise the wafer above the chuck 110 so that the wafer can be removed from the chamber by a robot. Before the lift pins can raise the wafer, the wafer must be "dechucked"; that is, the electrostatic force retaining the wafer on the chuck 100 must be removed. Conventionally, the chucking voltage supply 120 is turned off and the chuck electrode 113 and the wafer 101 are both connected to ground so as to remove the respective charges which had accumulated on the chuck electrode and the wafer during the previous application of the chucking voltage to the chuck electrode.

The wafer conventionally is grounded when the metal lift pins 142, which are grounded, strike the bottom of the wafer when the wafer is being lifted. Alternatively, the wafer conventionally is grounded by leaving the RF power supply on at a reduced power level to maintain a plasma 103 which provides an electrically conductive path from the wafer to the grounded walls 105 of the chamber.

2. Novel Dechucking Method

A problem we have observed with this conventional dechucking method is that it does not succeed in removing all of the electrostatic attractive force between the wafer and the chuck 110, so that excessive force is required to remove the wafer from the chuck. This force can crack the wafer, or it can cause the wafer to pop off the chuck into a position from which it is difficult to retrieve and align properly by a wafer transfer robot.

It is a discovery of the invention that the electrostatic force on the wafer can be essentially eliminated, thereby permitting easy removal of the wafer from the chuck, by applying between the chuck electrode 113 and the wafer a dechucking voltage having the same polarity as the chucking voltage, but having a smaller magnitude. It is a further discovery that there is an optimum value for the dechucking voltage; if the applied dechucking voltage is above or below this optimum value, a significant electrostatic attractive force will remain between the wafer and the chuck.

We believe the reason for this behavior is that a charge, of polarity opposite the polarity of the chucking voltage applied to the chuck electrode 113, accumulates in the upper dielectric 114 during the period the chucking voltage is applied to the chuck electrode 113. Because charges cannot readily flow in a dielectric, the conventional method of releasing the wafer from the chuck by grounding both the wafer and the chuck electrode does not remove the charge from the upper dielectric 114.

Accordingly, the invention can be regarded as a dechucking method which compensates for the effects of charge trapped in the upper dielectric 114. The invention is independent of how the dielectric acquired the charge. However, while the invention does not depend on the following theory, we believe the following physical mechanism is the principal reason the upper dielectric 114 accumulates negative charge when a large, positive chucking voltage is applied to the chuck electrode 113 relative to the wafer 101.

Because the wafer and the upper dielectric both have, at a microscopic level, imperfectly flat surfaces, the wafer and dielectric actually contact each other only at thousands of tiny points, leaving thousands of microscopic gaps between the wafer and dielectric. The chucking voltage between the wafer and the chuck electrode produces a strong electric field across these microscopic gaps. At chucking voltages high enough to securely retain the wafer on the chuck, we believe this electric field causes electrons to migrate from the wafer to the adjacent surface of the upper dielectric through the physical mechanism of "field emission". When the chucking voltage, and hence the electric field, is removed, the electrons accumulated in the dielectric have no discharge path, so they remain in the dielectric.

We have successfully tested the invention for applying a dechucking voltage to release a semiconductor wafer. Therefore, the utility of the invention is not dependent on whether our understanding of the physical mechanism for accumulation of charge on the upper dielectric proves to be accurate.

To simplify the description in the remainder of this patent specification, we will assume the chucking voltage applied to the chuck electrode is positive. Consequently, the charge accumulated in the upper dielectric 114 is negative. (If a negative chucking voltage were used, the operation of the invention would be the same, except all charges would be of opposite polarity.)

When a positive dechucking voltage is applied to chuck electrode 113 relative to the semiconductor wafer 101, a positive charge accumulates on the upper surface of chuck electrode 113. The amount of positive charge is proportional to the dechucking voltage multiplied by the capacitance between chuck electrode 113 and the wafer 101. We believe the optimum value of the dechucking voltage which releases the wafer is the value which produces a positive charge on the upper surface of the chuck electrode approximately equal to the negative charge in the upper dielectric 114. Under this condition, any electrostatic charge on the semiconductor wafer 101 will be negligible, so there will be essentially no electrostatic attraction force between the wafer and the chuck. In other words, the wafer will be released from the chuck.

For a given wafer and a given chucking voltage, the optimum dechucking voltage can be found empirically by the following series of steps: Step 1: Connect an adjustable voltage source between the chuck electrode and the wafer, and adjust it to supply the chucking voltage normally needed to retain the wafer on the chuck. At this point the electrostatic force should hold the wafer tightly against the chuck so that the wafer cannot readily slide across the surface of the chuck, much less be lifted from the chuck. Step 2: Incrementally reduce the voltage. After each incremental reduction, tap the edge of the wafer to observe whether the electrostatic force has been reduced sufficiently to allow the wafer to slide across the surface of the chuck. Step 3: When the wafer does slide, the voltage is close to the optimum dechucking voltage. If desired, the optimum voltage may be further refined by measuring the force required to mechanically lift the wafer from the chuck at different dechucking voltages close to the approximate optimum value found in step 2. The optimum dechucking voltage is the one which minimizes the mechanical force required to lift the wafer.

In summary, the method of releasing a semiconductor wafer from an electrostatic chuck (i.e., "dechucking" the wafer) is to apply a dechucking voltage between the chuck electrode and the wafer. The dechucking voltage has the same polarity as the previously applied chucking voltage and should approximately equal an optimum voltage value which minimizes or eliminates the electrostatic force holding the wafer on the chuck. The value of the dechucking voltage can be set to a value established empirically as described above, or, much more preferably, the value of the dechucking voltage can be set by the novel method described immediately below.

3. Practical Method of Determining Optimum Dechucking Voltage

The preceding empirical method of determining the dechucking voltage is impractical for production applications because we have found that the optimum dechucking voltage varies from one batch of wafers to the next.

The related U.S. patent application cited above discloses an automatic method of establishing the dechucking voltage by connecting the chucking voltage supply 120 between the chuck electrode 113 and the semiconductor wafer 101 while the wafer is some distance above the chuck 110, and then measuring the surge of current flow from the chucking voltage supply 120 when the wafer is lowered onto the upper dielectric 114 of the chuck 110. However, this method requires a precisely timed electronic measurement of an electrical pulse between the wafer and the chuck that occurs as the wafer is lowered onto the chuck. Thus, this method is relatively difficult to carry out, requiring sophisticated electronic circuitry.

A difficulty of using the foregoing method in production is that the backside of some wafers have a thin dielectric coating of silicon dioxide or silicon nitrite. If the thickness of that coating is sufficient to prevent the lift pins 144 from making electrical contact to the semiconductor (silicon) wafer, then the current pulse representing the residual change may not be accurately measured and hence the calculated dechucking voltage may be in error.

The remainder of this specification describes a much simpler and more repeatable method of establishing the dechucking voltage requiring no precisely timed electronic measurements and which is therefore easier to carry out. This method takes advantage of the use of helium cooling of the bottom surface of the wafer as it is held on the electrostatic chuck. Basically, the method determines the optimum dechucking voltage by reducing the applied potential on the electrostatic chuck electrode 113 from the relatively high chucking voltage downwardly in small steps while monitoring the leak rate of the helium beneath the wafer. As soon as the leakage rate increases by a predetermined threshold proportion, the most recent applied chuck voltage is stored in a memory. This stored voltage is the optimum dechucking voltage. Preferably, this threshold is chosen to correspond to a point at which the wafer is beginning to float on the pedestal to permit helium to leak out therebetween, indicating a near nullification of the residual electrostatic forces on the wafer.

Figure 2:
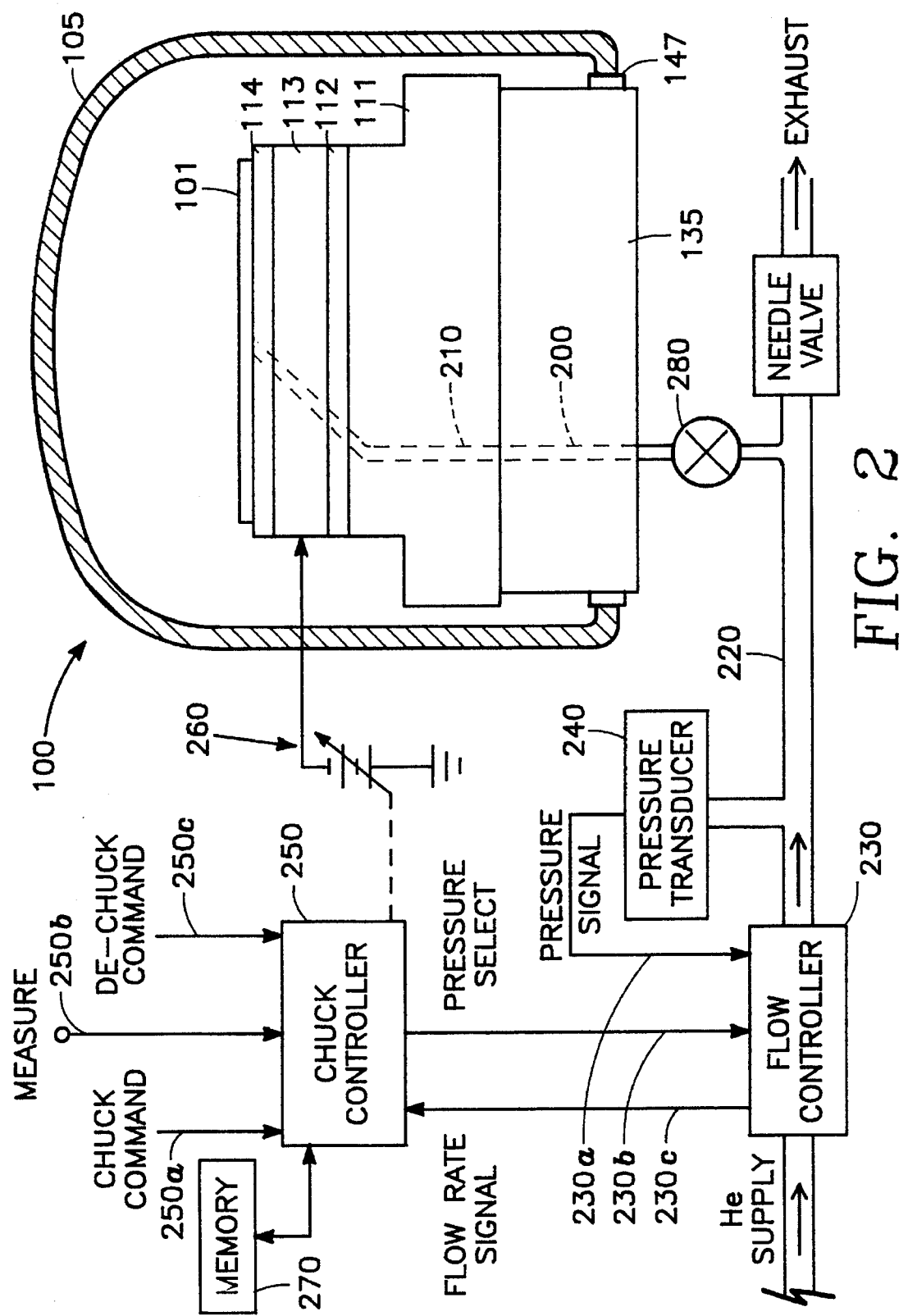
FIG. 2 is a simplified schematic diagram of a plasma reactor including apparatus for carrying out the present invention.

Referring now to FIG. 2, the apparatus of FIG. 1 further includes a passage 200 through the cathode base 135 and a passage 210 through the wafer pedestal 111 through which an inert cooling gas such as helium is pumped against the bottom side of the wafer. Preferably, the upper dielectric layer 114 has small channels in its top surface which permit the gas to distribute evenly under the wafer 101. The purpose of this feature is to regulate the wafer temperature during plasma-enhanced processing.

The helium gas flow from a gas supply and pump (not shown in FIG. 2) through a supply line 220 to the gas passage 200 is regulated by a conventional mass flow controller 230. A pressure transducer 240 senses the pressure in the supply line 220 and transmits an analog signal indicating the sensed pressure to a sensor input 230a of the mass flow controller 230. The mass flow controller 230 varies the helium flow rate through the supply line 220 so as to reduce the error between the analog pressure signal input 230a and a preset pressure select input 230b. For example, if the pressure select input 230b is set to 8 Torr (as it is typically during processing), then the mass flow controller 230 increases the flow rate whenever the sensed pressure falls below 8 Torr and decreases the flow rate whenever the sensed pressure exceeds 8 Torr. Furthermore, the mass flow controller measures the actual gas flow rate into the supply line 220 and generates an analog flow rate signal at its flow rate output 230c.

The method of the present invention is carried out by monitoring the flow rate signal output 230c while decreasing the applied voltage on the electrostatic chuck electrode 113 in discrete steps. As soon as the flow rate (indicated by the flow rate signal output 230c) increases by a predetermined percentage, the most recent applied voltage on the electrostatic chuck electrode is stored as the optimum dechucking voltage. At this point, the helium is turned off, the newly calculated voltage is applied to the chuck, the plasma is turned off and the wafer is lifted off of the pedestal.

Preferably, the helium pressure in the supply line 220 is set to a predetermined pressure when determining the optimum dechucking voltage. This predetermined helium pressure results in a determination of optimum dechucking voltage closely corresponding to the determination obtained using the electrical pulse measurement method of the above-referenced related patent application. For an 8-inch wafer, this predetermined helium pressure is 4 Torr and the threshold percentage increase in helium flow rate is 25%. At this threshold, the wafer 101 is just starting to float on the pedestal 111, creating a helium leak therebetween, indicating that the residual electrostatic forces on the wafer 101 have been nearly nullified. If a larger helium pressure is used, then a smaller threshold percentage should be selected. In any case, the determining method of the present invention includes a preparation step in which the helium pressure in the supply line 220 is changed to a predetermined pressure (e.g., 4 Torr) and a finishing step after the optimum dechucking voltage has been determined of returning the helium pressure to the operating level (e.g., 8 Torr). These changes in the helium pressure are carried out preferably by controlling the pressure select input 230b of the mass flow controller 230.

Figure 3:
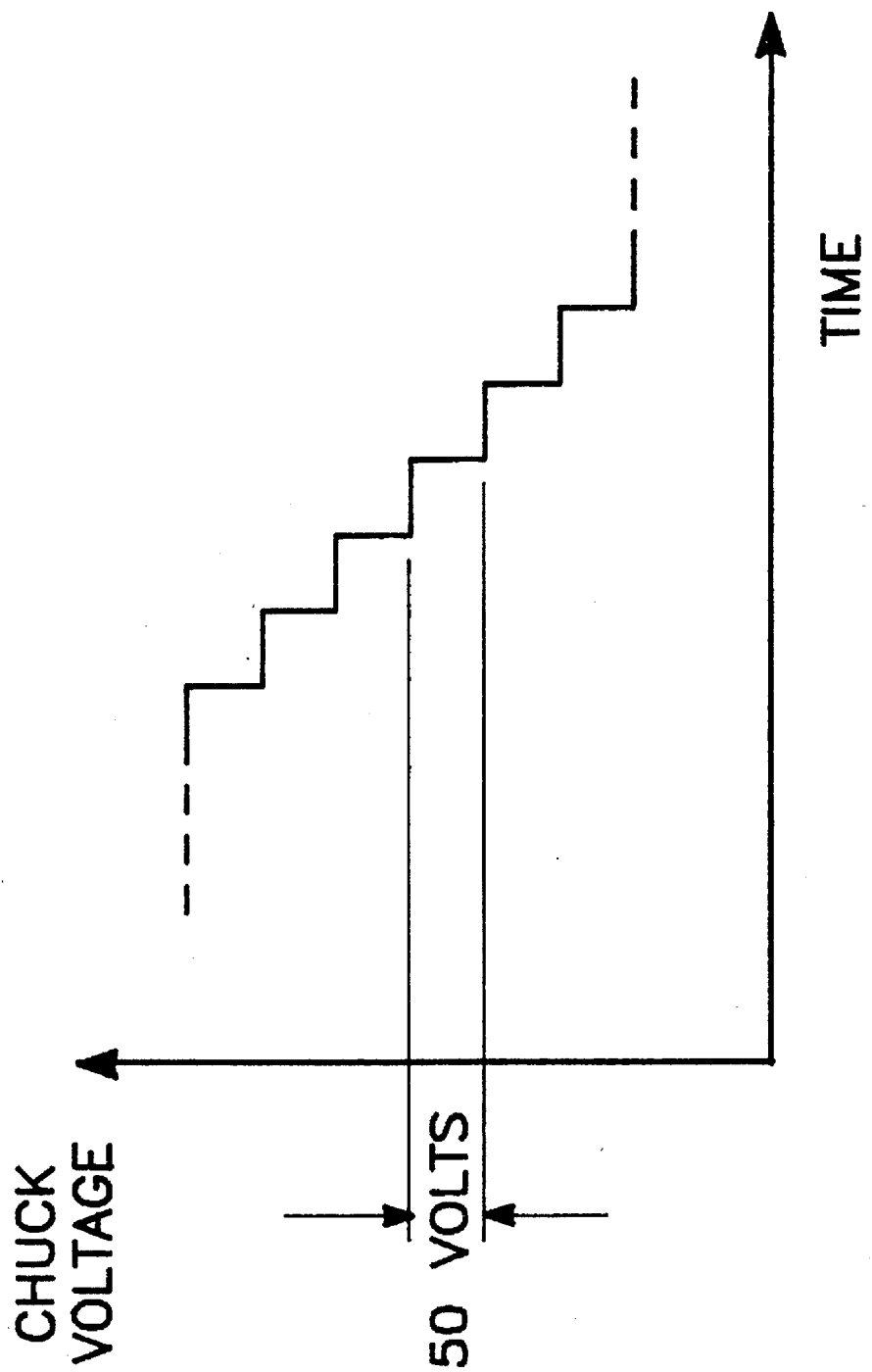
FIG. 3 is a graph illustrating the step-wise reduction in applied electrostatic chuck voltage over time during the determination of the optimum dechucking voltage.
Figure 4:
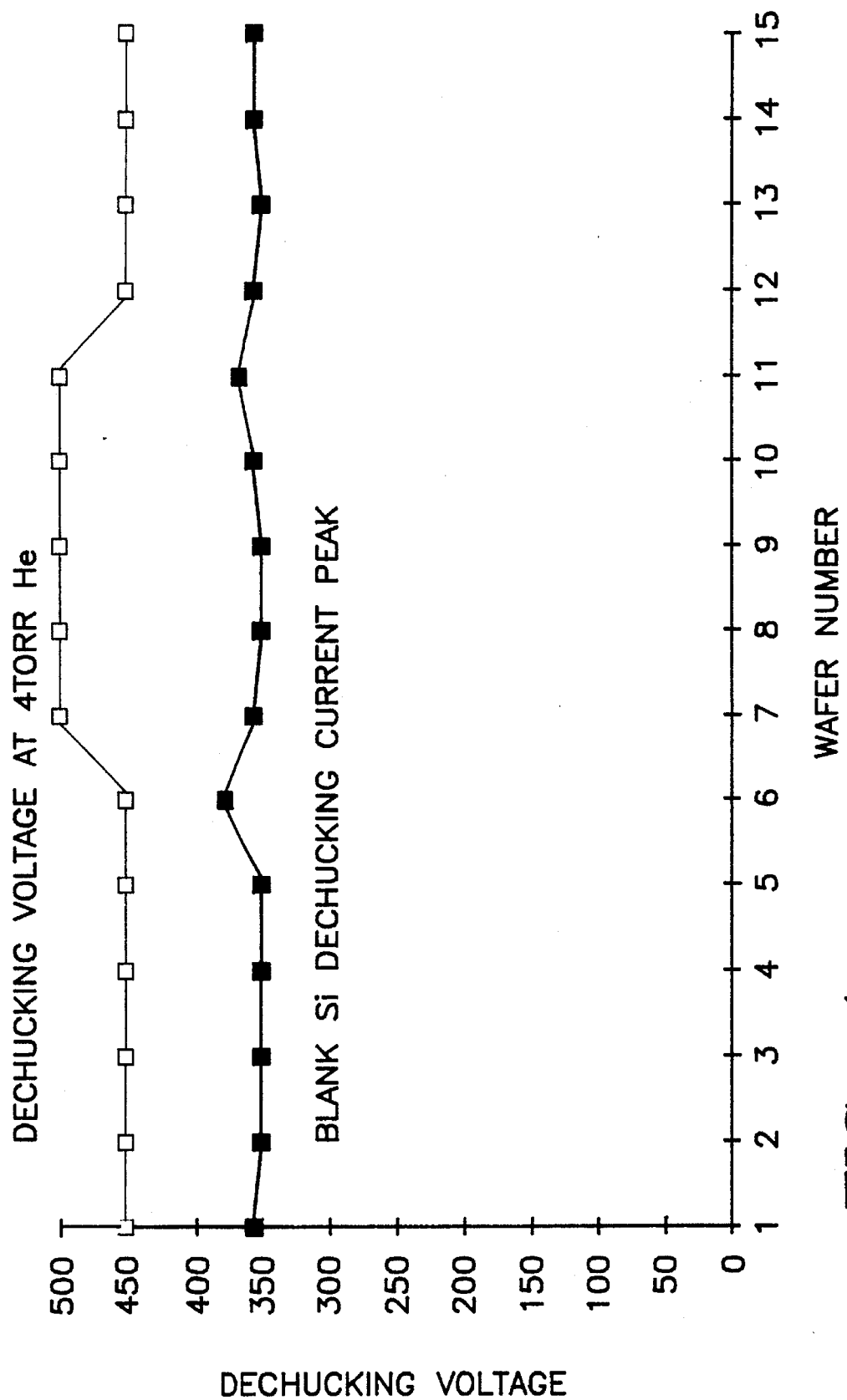
FIG. 4 is a graph of the optimum dechucking voltage measured for a number of different blank silicon 8-inch wafers using the method of the present invention (empty boxes) and using the method of the above-referenced related patent application (solid boxes).

Preferably, the step-wise reduction in the applied electrostatic chuck voltage is carried out in 50 volt steps. The time between steps depends upon the settling time of the system and the time required for the mass flow controller 230 to respond to a change in pressure. Preferably, the time between steps is slightly greater than the time required by the mass flow controller 230 to respond to pressure changes. A graph illustrated in FIG. 3 shows the step-wise reduction in applied electrostatic chuck voltage over time during the determination of the optimum dechucking voltage. FIG. 4 is a graph of the optimum dechucking voltage measured for a number of different blank silicon 8-inch wafers using the method of the present invention (empty boxes) and using the method of the above-referenced related patent application (solid boxes).

Referring again to FIG. 2, the method of the present invention can be carried out using a chuck controller 250 (implemented as a pre-programmed microprocessor, for example) which responds to a chuck command input 250a, determine enable input 250b and a dechuck command input 250c.

Whenever the chuck command input 250a is "high" the chuck controller 250 causes a variable voltage source 260 to apply a chucking voltage (e.g., 2000 volts D.C.) to the electrostatic chuck electrode 113.

Thereafter, whenever the determine enable input 250b is "high", the chuck controller 250 transmits a command on the pressure select input 230b to reduce the gas coolant (helium) pressure to the optimum pressure for dechucking voltage determination (i.e., 4 Torr). Then, the dechucking controller 250 stores the present helium flow rate value indicated by the flow rate signal output 230c in a memory 270. Next, the dechucking controller 250 causes the variable voltage supply 260 to begin reducing the voltage on the electrostatic chuck electrode 113 in the step-wise manner of FIG. 3. At each step, the dechucking controller 250 temporarily stores the new value of the flow rate obtained from the current flow rate signal from the output 230c and computes a proportional change in flow rate from the initial flow rate value stored in the memory 270 in accordance with the following formula:

$$(F_{new} - F_{initial})/(F_{initial} - F_0)$$

where $F_{initial}$ is the initial flow rate stored in the memory 270 when the chucking voltage was maximum, $F_{new}$ is the flow rate measured after the latest step reduction in the applied voltage on the chucking electrode 113 and $F_0$ is the flow rate measured with a valve 280 to the input line 200 turned off (reflecting leakage in the supply line 220). Note that this requires that the chuck controller 250 obtain a measurement of the flow rate prior to the opening of the valve 280. Thereafter, the valve 280 is opened and the wafer 101 is placed on the pedestal 111. With this formula, for an 8-inch wafer and a helium pressure of 4 Torr, the threshold percentage change in flow rate is 25%.

As soon as a voltage step is reached in which a flow rate change greater than 25% is computed by the chuck controller 250, the then-current voltage applied to the chuck electrode 113 is stored by the chuck controller 250 in the memory 270 as the optimum dechucking voltage for the particular wafer currently on the wafer pedestal. Preferably, the dechucking voltage is applied while the plasma is turned off, the helium is turned off and the wafer is lifted off of the pedestal.

In an alternative embodiment of the invention, in order to save time the dechucking voltage may be stored in the memory 270 for repeated use for dechucking each wafer in a batch of wafers being processed sequentially. This has the advantage of minimizing any particle contamination created by the helium dechucking step of the invention. In this alternative embodiment, after the wafer is removed, a new wafer is put on the pedestal and the system is returned to its operating conditions, including the application of the initial chucking voltage, and then wafer processing, such as plasma-enhanced wafer processing, is carried out. In this alternative embodiment, the new wafer is dechucked by the quick expedient of applying the dechucking voltage previously stored in the memory 270. Whenever the dechuck command input 250c is "high", the chuck controller 250 retrieves the optimum dechucking voltage from the memory 270 and changes the variable voltage source 260 to that voltage. The wafer handling robot apparatus (not shown) then removes the wafer 101 from the wafer pedestal 111.

While the invention has been described with reference to an embodiment in which the optimum dechucking voltage is determined while the helium pressure is at about 4 Torr, this pressure may be increased provided that the threshold increase in flow rate is decreased by an appropriate amount.

While the invention has been described with reference to an embodiment in which helium is used as the coolant gas on the wafer backside, any other suitable coolant gas may be used, such as an inert gas.

While the invention has been described in detail by specific reference to preferred embodiments, it is understood that variations and modifications thereof may be made without departing from the true spirit and scope of the invention.

What is claimed is:

1. A method of determining an optimum de-chucking voltage for nullifying residual electrostatic forces on a wafer in an electrostatic chuck for removal of the wafer from the chuck, comprising:

holding said wafer on said electrostatic chuck by applying an electrostatic potential to said chuck;

introducing a gas between said wafer and said chuck;

reducing said electrostatic potential of said chuck while observing a rate of leakage of said gas from between said wafer and said chuck; and recording as said optimum dechucking voltage the value of said electrostatic potential obtaining when said rate of leakage exceeds a predetermined threshold.

2. The method of claim 1 wherein the step of observing said rate of leakage comprises comparing a current value of a flow rate of said gas with a value of a flow rate of said gas measured prior to the step of reducing said electrostatic potential.

3. The method of claim 1 wherein the step of reducing said electrostatic potential is performed in discrete steps, and wherein the step of observing a rate of leakage is repeated at each step.

4. The method of claim 1 wherein said predetermined threshold corresponds to a point at which said wafer begins to float on said electrostatic chuck.

5. The method of claim 1 wherein said threshold is on the order of approximately 25%.

6. The method of claim 1 further comprising maintaining said gas between said wafer and said chuck at a pressure suited for said determining method.

7. The method of claim 6 wherein said pressure is on the order of approximately 4 Torr.

8. The method of claim 7 wherein said predetermined threshold is on the order of approximately 25%.

9. The method of claim 3 wherein said steps are each a decrease in said electrostatic potential of on the order of approximately 50 volts.

10. The method of claim 9 wherein prior to the step of reducing, said electrostatic potential has an initial value in the range of between about one thousand and several thousand volts.

11. The method of claim 1 wherein said gas comprises an inert gas.

12. The method of claim 2 further comprising measuring said flow rate prior to pressurizing the gas between said wafer and said chuck, and wherein the step of observing is performed in accordance with the following formula:

$$(F_{new} - F_{initial})/(F_{initial} - F_0)$$

where $F_{initial}$ is the initial flow rate observed prior to the reducing step, $F_{new}$ is a flow rate measured during the step of reduction and $F_0$ is the flow rate measured prior to pressurization of the gas between said wafer and said chuck.

13. The method of claim 1 wherein said chuck comprises a chuck electrode to which said electrostatic potential is applied and an insulating layer between said chuck electrode and said wafer, and wherein said residual electrostatic force arises from electric charge from said wafer trapped in said insulating layer.

14. A method of de-chucking a wafer from an electrostatic chuck, comprising:

holding said wafer on said electrostatic chuck by applying an electrostatic potential to said chuck;

introducing a gas between said wafer and said chuck;

reducing said electrostatic potential of said chuck while observing a rate of leakage of said gas from between said wafer and said chuck;

recording as said optimum dechucking voltage the value of said electrostatic potential obtaining when said rate of leakage exceeds a predetermined threshold; and returning said electrostatic potential to the value thereof recorded during said recording step and mechanically lifting said wafer from said chuck.

15. The method of claim 14 wherein said recording step is followed by performing plasma-enhanced processing of said wafer while said wafer is held on said electrostatic chuck.

16. The method of claim 14 wherein the step of observing said rate of leakage comprises comparing a current value of a flow rate of said gas with a value of a flow rate of said gas measured prior to the step of reducing said electrostatic potential.

17. The method of claim 14 wherein the step of reducing said electrostatic potential is performed in discrete steps, and wherein the step of observing a rate of leakage is repeated at each step.

18. The method of claim 14 wherein said predetermined threshold corresponds to a point at which said wafer begins to float on said electrostatic chuck.

19. The method of claim 14 wherein said threshold is on the order of approximately 25%.

20. The method of claim 14 further comprising maintaining said gas between said wafer and said chuck at a pressure suited for said de-chucking method.

21. The method of claim 20 wherein said pressure is on the order of approximately 4 Torr.

22. The method of claim 21 wherein said predetermined threshold is on the order of approximately 25%.

23. The method of claim 16 wherein said steps are each a decrease in said electrostatic potential of on the order of approximately 50 volts.

24. The method of claim 23 wherein prior to the step of reducing, said electrostatic potential has an initial value in the range of between about one thousand and several thousand volts.

25. The method of claim 14 wherein said gas comprises an inert gas.

26. The method of claim 16 further comprising measuring said flow rate prior to pressurizing the gas between said wafer and said chuck, and wherein the step of observing is performed in accordance with the following formula:

$$(F_{new} - F_{initial})/(F_{initial} - F_0)$$

where $F_{initial}$ is the initial flow rate observed prior to the reducing step, $F_{new}$ is a flow rate measured during the step of reduction and $F_0$ is the flow rate measured prior to pressurization of the gas between said wafer and said chuck.

27. Apparatus for determining an optimum de-chucking voltage for nullifying residual electrostatic forces on a wafer in an electrostatic chuck for removal of the wafer from the chuck, comprising:

a variable power supply for applying an electrostatic potential to said chuck of an initial value sufficient to hold said wafer to said chuck;

a mass flow controller for regulating the pressure of gas between said wafer and said chuck and indicating a rate of leakage of said gas from between said wafer and said chuck;

a chuck controller for reducing said electrostatic potential of said chuck while observing said rate of leakage of said gas from between said wafer and said chuck and determining when said rate of leakage exceeds a predetermined threshold; and a memory responsive to said chuck controller for recording as said optimum dechucking voltage the value of said electrostatic potential obtained when said rate of leakage exceeds a predetermined threshold.

28. The apparatus of claim 27 wherein said chuck controller determines when said rate of leakage exceeds said predetermined threshold by comparing a current value of a flow rate of said gas with a value of a flow rate of said gas measured prior to the step of reducing said electrostatic potential.

29. The apparatus of claim 27 wherein said chuck controller reduces said electrostatic potential in discrete steps, and wherein said chuck controller observes said rate of leakage at each step.

30. The apparatus of claim 27 wherein said predetermined threshold corresponds to a point at which said wafer begins to float on said electrostatic chuck.

31. The apparatus of claim 27 wherein said threshold is on the order of approximately 25%.

32. The apparatus of claim 27 wherein said mass flow controller maintains said gas between said wafer and said chuck at a pressure suited for said determining apparatus.

33. The apparatus of claim 32 wherein said pressure is on the order of approximately 4 Torr.

34. The apparatus of claim 33 wherein said predetermined threshold is on the order of approximately 25%.

35. The apparatus of claim 28 wherein said steps are each a decrease in said electrostatic potential of on the order of approximately 50 volts.

36. The apparatus of claim 35 wherein said electrostatic potential has an initial value in the range of between about one thousand and several thousand volts.

37. The apparatus of claim 27 wherein said gas comprises an inert gas.

38. The apparatus of claim 27 wherein said chuck comprises a chuck electrode to which said electrostatic potential is applied and an insulating layer between said chuck electrode and said wafer, and wherein said residual electrostatic force arises from electric charge from said wafer trapped in said insulating layer.

39. In a vacuum processing environment, a method of releasing a workpiece from an electrostatic chuck, wherein the chuck includes dielectric elements and at least one electrode energized with a first voltage to electrostatically attract the workpiece to the chuck with a first electrostatic force, and wherein the chuck further includes a gas passageway therethrough, the method comprising the steps of:

supplying a heat transmission gas via the gas passageway between the workpiece and chuck while the workpiece is held to the chuck by electrostatic attraction;

while reducing the supply of heat transmission gas to the passageway, energizing the electrode with a second voltage of the same polarity as said first voltage, of a magnitude smaller than the first voltage, and which would result in a second electrostatic attractive force smaller than said first force;

and thereafter physically removing the workpiece from the chuck.

40. The method of claim 39, which further includes the steps of monitoring the rate of leakage of the gas from between the wafer and the chuck and comparing same to one or more predetermined levels of leakage.

41. The method of claim 40, in which said level of leakage corresponds to said smaller electrostatic attraction force of a reduced magnitude to permit the wafer to begin to float on the pedestal under the influence of the heat transmission gas.

42. The method of claim 41, in which the second voltage is of a magnitude to produce said smaller electrostatic force.

43. The method of claim 40, which further includes the step of selecting the second voltage to produce a second electrostatic force of reduced magnitude which would permit the wafer to begin to float on the pedestal.

44. The method of claim 43, in which a trial workpiece is processed using said steps of monitoring, comparing and selecting to determine a value for said second voltage, and in which subsequent workpieces are processed without one or more of said monitoring, comparing and selecting steps.

45. The method of claim 44, which further includes the step of storing the value of the second voltage obtained using the trial workpiece, and utilizing said stored value as said second voltage for subsequent workpieces.

46. The method of claim 39, in which the workpiece is removed from the chuck while the electrode is energized at said second voltage.

47. The method of claim 39, in which the heat transmission gas is supplied at a preselected pressure.

48. The method of claim 39, which further includes the steps of:

selecting said second voltage of a magnitude which permits the wafer to begin to float on the pedestal; and fixing the value of such selected second voltage.

49. The method of claim 39, in which said selecting step is performed for a first workpiece of a plurality to be processed, and the value of said second voltage which is thereby selected is thereafter utilized as said second voltage for the remainder of said plurality.

50. In a vacuum processing environment, a method of releasing a workpiece from an electrostatic chuck, wherein the chuck includes dielectric elements and at least one electrode energized with a first voltage to electrostatically attract the workpiece to the chuck with a first electrostatic force, and wherein the chuck further includes a gas passageway therethrough, the method comprising the steps of:

supplying a heat transmission gas via the gas passageway between the workpiece and chuck while the workpiece is held to the chuck by electrostatic attraction;

while reducing the supply of heat transmission gas to the passageway, energizing the electrode with a second voltage, of a magnitude smaller than said first voltage, and which would result in a reduced electrostatic attraction permitting a leakage rate of the heat transmission gas into the vacuum processing environment exceeding a predetermined level;

and thereafter physically removing the wafer from the chuck.

51. The method of claim 50 wherein the step of supplying comprises supplying said gas at a preselected pressure.

52. The method of claim 50 wherein said second voltage is of the same polarity as said first voltage.

53. The method of claim 50, which further includes the steps of monitoring the rate of leakage of the gas from between the wafer and the chuck and comparing same to one or more predetermined levels of leakage.

54. The method of claim 53, in which said level of leakage corresponds to said reduced electrostatic attraction force of a reduced magnitude to permit the wafer to begin to float on the pedestal under the influence of the heat transmission gas.

55. The method of claim 54, in which the second voltage is of a magnitude to produce said reduced electrostatic force.

56. The method of claim 53, which further includes the step of selecting the second voltage to produce a second electrostatic force of reduced magnitude which would permit the wafer to begin to float on the pedestal.

57. The method of claim 56, in which a trial workpiece is processed using said steps of monitoring, comparing and selecting to determine a value for said second voltage, and in which subsequent workpieces are processed without one or more of said monitoring, comparing and selecting steps.

58. The method of claim 57, which further includes the step of storing the value of the second voltage obtained using the trial workpiece, and utilizing said stored value as said second voltage for subsequent workpieces.

59. The method of claim 50, in which the workpiece is removed from the chuck while the electrode is energized at said second voltage.

60. The method of claim 50, which further includes the steps of:

selecting a second voltage of a magnitude which permits the wafer to begin to float on the pedestal; and fixing the value of such selected second voltage.

61. The method of claim 50, in which said selecting step is performed for a first workpiece of a plurality to be processed, and the value of second voltage which is thereby selected is thereafter utilized as said second voltage for the remainder of said plurality.

* * * * *